(12) United States Patent
Woo et al.

(10) Patent No.: US 10,109,636 B2
(45) Date of Patent: Oct. 23, 2018

(54) ACTIVE CONTACT AND GATE CONTACT INTERCONNECT FOR MITIGATING ADJACENT GATE ELECTRODE SHORTAGES

(71) Applicant: GLOBALFOUNDRIES Inc., Grand Cayman (KY)

(72) Inventors: Youngtag Woo, San Ramon, CA (US); Bipul C. Paul, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/453,124

(22) Filed: Mar. 8, 2017

(65) Prior Publication Data

US 2018/0261604 A1 Sep. 13, 2018

(51) Int. Cl.
*H01L 29/76* (2006.01)
*H01L 29/94* (2006.01)
*H01L 27/11* (2006.01)
*H01L 21/8234* (2006.01)
*H01L 27/02* (2006.01)
*H01L 21/3213* (2006.01)
*H01L 21/768* (2006.01)

(52) U.S. Cl.
CPC .... *H01L 27/1104* (2013.01); *H01L 21/32139* (2013.01); *H01L 21/76895* (2013.01); *H01L 21/823437* (2013.01); *H01L 21/823475* (2013.01); *H01L 27/0207* (2013.01)

(58) Field of Classification Search
CPC ......... H01L 21/823431; H01L 27/0207; H01L 21/823437; H01L 21/823475; H01L 27/1104; H01L 21/76895
USPC ........................................................ 257/401
See application file for complete search history.

(56) References Cited

U.S. PATENT DOCUMENTS

| | | | |
|---|---|---|---|
| 6,175,138 B1* | 1/2001 | Noda | H01L 27/11 257/391 |
| 8,076,236 B2 | 12/2011 | Schultz et al. | |
| 2005/0179094 A1* | 8/2005 | Kim | G11C 11/412 257/379 |
| 2005/0258498 A1* | 11/2005 | Suzuki | H01L 21/76838 257/382 |

* cited by examiner

*Primary Examiner* — Theresa T Doan
(74) *Attorney, Agent, or Firm* — Francois Pagette; Hoffman Warnick LLC

(57) ABSTRACT

A method of forming an active contact-gate contact interconnect including forming a first gate contact to a first gate electrode in an active region in a substrate, forming a first active contact to another portion of the first active region. The first gate contact and the first active contact include an approximately equal surface area, and forming an interconnect between the first active contact and the first gate contact. The interconnect includes a first metal wire in a first metal layer electrically connecting the first active contact to the first gate contact. The method may also include forming a second metal wire in the first metal layer configured to electrically connect a third metal wire in a second metal layer to an external contact to a second active region in the substrate, the external contact including the approximately equal surface area.

8 Claims, 8 Drawing Sheets

ACTIVE CONTACT AND GATE CONTACT INTERCONNECT FOR MITIGATING ADJACENT GATE ELECTRODE SHORTAGES

BACKGROUND

The present disclosure relates to semiconductor device fabrication, for example, six-transistor static random access memory (6T SRAM) bitcells. The present disclosure relates more specifically to active contact-gate contact interconnects for mitigating adjacent gate electrode shortages.

As the dimensions of transistor devices continue to shrink, various issues arise imposing increasing demands for fabrication of more condensed components. For example, smaller transistors allow more transistors to be placed on a single substrate and thereby allow relatively large circuit systems to be incorporated on a single, relatively small die area. However, smaller transistors also require reduced feature sizes and overall device scaling. Aggressive scaling of, e.g., a six transistor static random access memory (6T SRAM) bitcells, can be difficult to implement since the scaling generally causes a decrease in contacted polysilicon pitch (CPP) distance between gate electrodes. Use of current contact interconnect formation techniques, e.g. gate-active contact overlap, generally results in higher risk of shortages of adjacent gate electrodes and thus functional loss of the device. Additionally, use of current contact interconnect layouts including contacts of varying shapes and sizes may result in parametric yield loss of the device.

SUMMARY

A first aspect of the disclosure is directed to a method of fabricating a gate electrode-active region interconnect for a gate electrode cross-coupling of inverters in a static random access memory (SRAM) bitcell, the method comprising forming a first active region in a cross-coupling region of a substrate, the first active region including a first gate electrode; forming a first gate contact to the first gate electrode; forming a first active contact to another portion of the first active region wherein the first gate contact and the first active contact include an approximately equal surface area; and forming an interconnect between the first active contact and the first gate contact, wherein the interconnect includes a first metal wire in a first metal layer over the first gate contact and the first active contact, the first metal wire electrically connecting the first active contact to the first gate contact.

A second aspect of the disclosure includes a static random access memory (SRAM) bitcell structure comprising a gate contact to a gate electrode of an active region in a substrate; an active contact to another portion of the active region, wherein the active contact and the gate contact include an approximately equal surface area; and an interconnect, the interconnect electrically connecting the active contact to the gate contact, wherein the interconnect includes a first metal wire in a first metal layer over a portion of the active contact and a portion of the gate contact.

A third aspect of the disclosure is related to a method of fabricating a static random access memory (SRAM) bitcell, the method comprising forming a plurality of active contacts to a plurality of active regions in a substrate including at least eight active regions; forming a plurality of gate contacts to a plurality of gate electrodes, the plurality of gate electrodes including at least four gate electrodes, wherein the plurality of gate contacts and the plurality of active contacts include an approximately equal surface area; forming a first metal layer, the first metal layer including: at least one interconnect electrically connecting one of the plurality of active contacts to one of the plurality of gate contacts, wherein the at least one interconnect includes a first metal wire over a portion of the one of the active contacts and a portion of the one of the gate contacts; and at least one second metal wire over either a second active contact or a second gate contact; and routing at least one external component to the either second active contact or second gate contact by a second metal wire in another metal layer through the at least one second metal wire.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The embodiments of the disclosure are described in an illustrative example in the context of a cross-coupling region of a six-transistor static random access memory (6T SRAM)

bitcell. Nevertheless, it is understood that the contextual example herein is illustrative, and the embodiments of the disclosure may be implemented in a variety of alternative devices.

Figure 1:
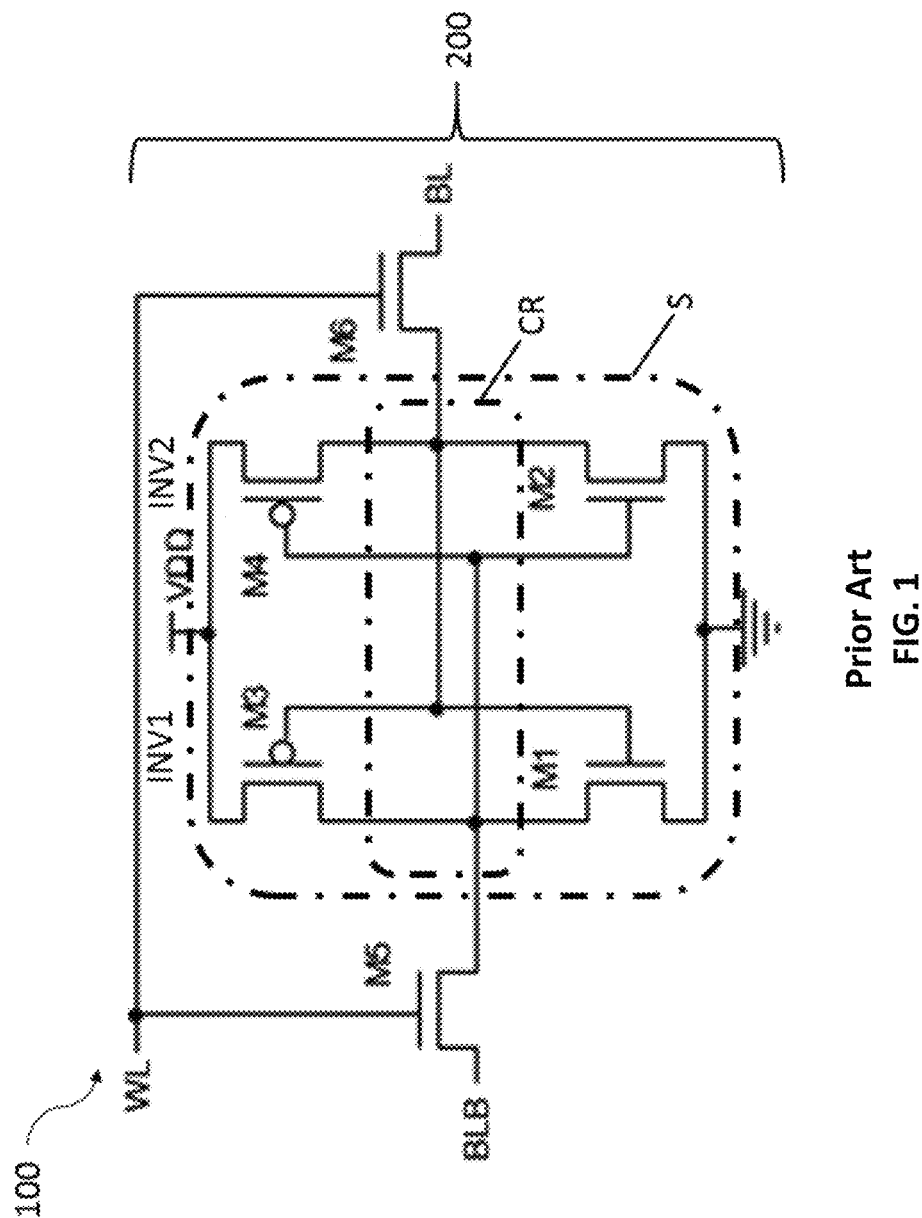
FIG. 1 shows a schematic of an example six-transistor static random access memory (6T SRAM) bitcell, including a cross-coupling region (in phantom), according to embodiments of the disclosure.

Referring to the drawings, FIG. 1 shows a schematic of a standard six-transistor static random access memory (6T SRAM) bitcell 200. As shown in FIG. 1, 6T SRAM bitcell 200 may include for example, six metal-oxide semiconductor field-effect transistors (MOSFET) M1, M2, M3, M4, M5, M6 interconnected to a positive voltage supply, VDD, and ground. As shown in the example of FIG. 1, transistors M5, M6 may be connected to a wordline, WL. Also shown in the example of FIG. 1, transistors M6, M5 may be connected with a first bitline, BL, and a second bitline, BLB, respectively.

As shown in FIG. 1, a storage cell S for storing bits within 6T SRAM 200 may include transistors M1, M2, M3, M4. Transistors M3, M1 may be connected to form a first inverter INV1, and transistors M4, M2 may be connected to form a second inverter INV2. Inverters INV1, INV2 may be cross-coupled in a cross-couple region CR, of 6T SRAM bitcell 200 to form the storage cell S. Cross-coupling of inverters INV1, INV2 may include interconnecting a gate—of inverter INV1 with an active region (not shown) of inverter INV2, and interconnecting gate—of inverter INV2 to active region (not shown) of inverter INV1.

As the dimensions of SRAM bitcell components decrease, more transistors are compacted within an integrated circuit, and the contacted polysilicon (poly) pitch (CPP) distance between neighboring gate electrodes (not shown) of transistors M1, M2, M3, M4 decreases. As a result, conventional methods of interconnecting gate electrodes and active regions of transistors include higher risks of shorting neighboring gate electrodes.

Figure 2A:
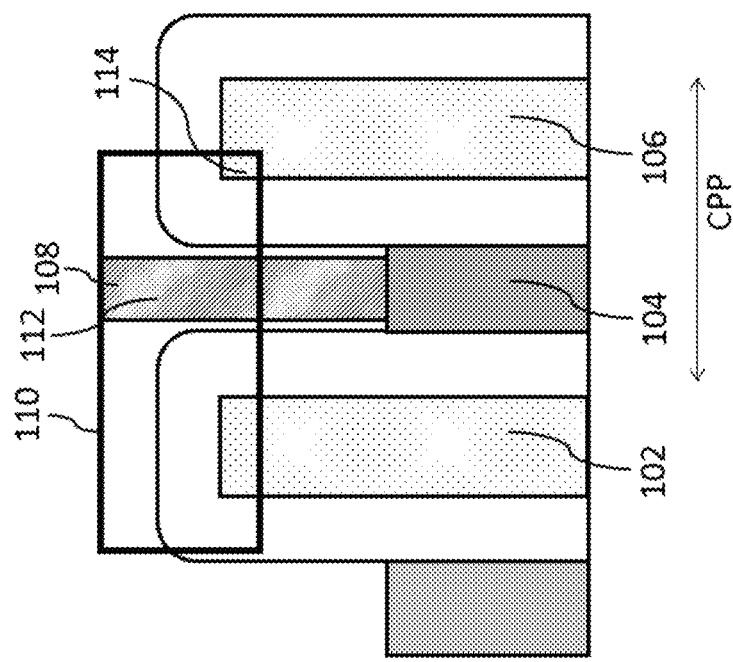
FIGS. 2a and 2b show a cross-sectional view of examples of prior art formation of active contact-gate contact interconnection, for example for cross-coupling in a 6T SRAM bitcell, according to embodiments of the disclosure.
Figure 2B:
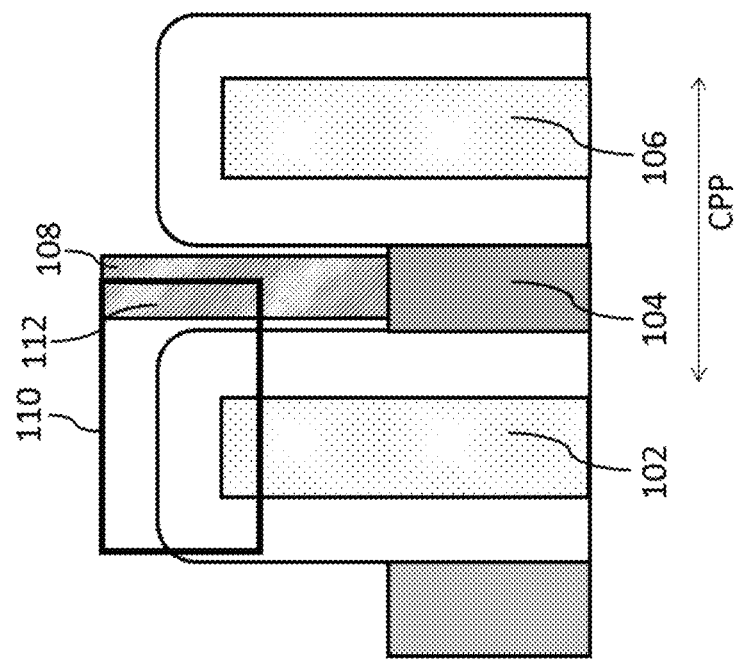

FIGS. 2a and 2b show a cross-sectional view of a illustrative examples of a conventional technique for interconnecting a gate electrode 102 and an active region 104, for example, for cross-coupling inverters INV1, INV2 (see FIG. 1) in cross-couple region CR (see FIG. 1). As shown in the examples of FIGS. 2a and 2b, conventional interconnecting of gate electrode 102 and active region 104 may include formation of an active contact 108 to active region 104 and gate contact 110 to gate electrode 102. In conventional processing, formation of active contact 108 and gate contact 110 may include overlapping contacts 112 to electrically connect gate electrode 102 and active region 104. Specifically, FIG. 2b shows an illustrative example of neighboring gate electrode shortage 114 of neighboring gate electrode 106 from conventional techniques of interconnecting gate electrode 102 and active region 104.

As described above, as the size of the transistors in an SRAM decreases, more transistors are compacted within an integrated circuit, causing the space between gate electrodes (e.g. neighboring gate electrode 106 and gate electrode 102) to decrease. As shown in FIG. 2, under conventional techniques for contact formation and interconnect formation, as the CPP decreases, gate electrode shortage 114 of neighboring gate electrode 106 becomes increasingly likely.

Figure 3:
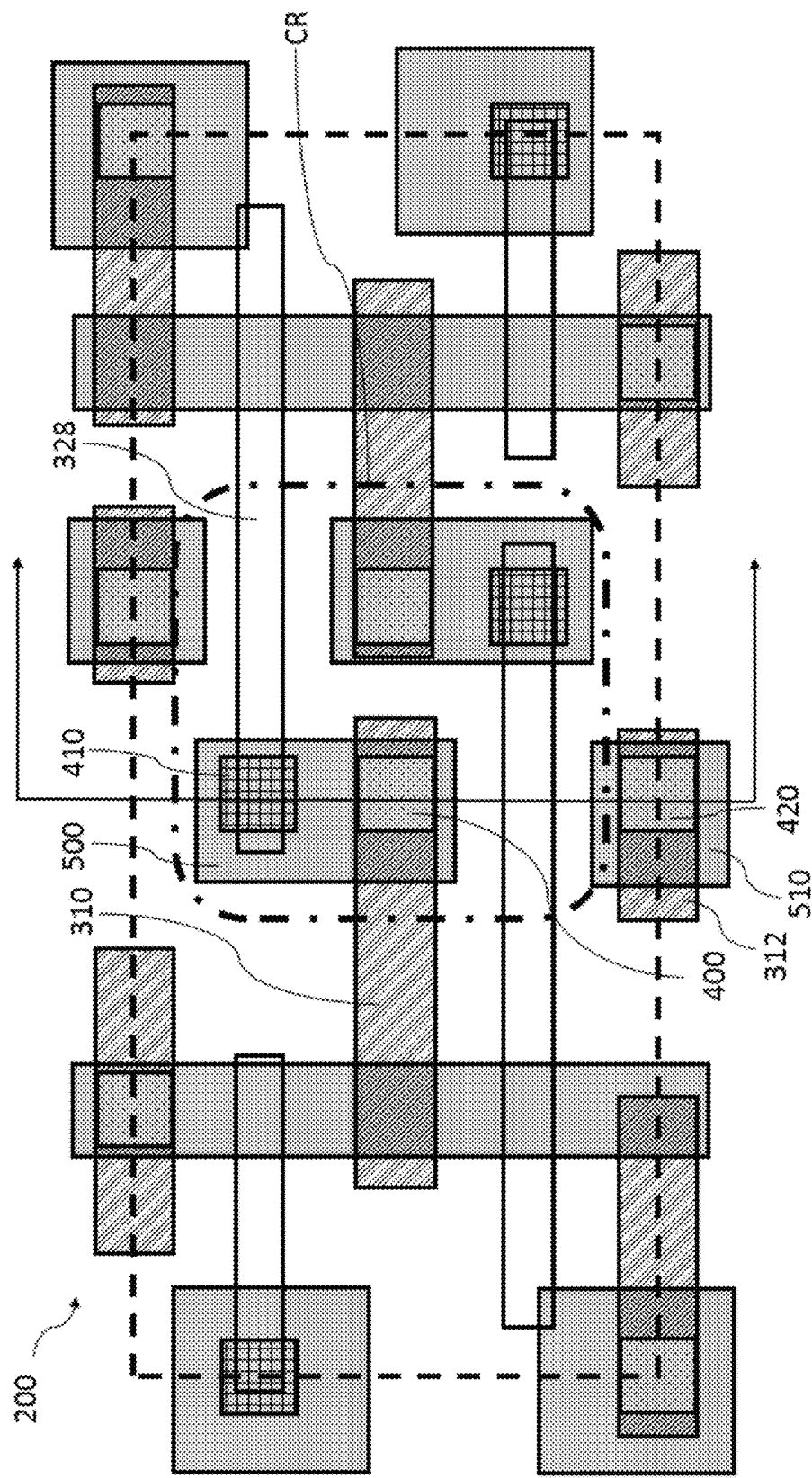
FIG. 3 shows a top view of an illustrative portion of the 6T SRAM bitcell of FIG. 1, including the cross-coupling region, according to embodiments of the disclosure.
Figure 4:
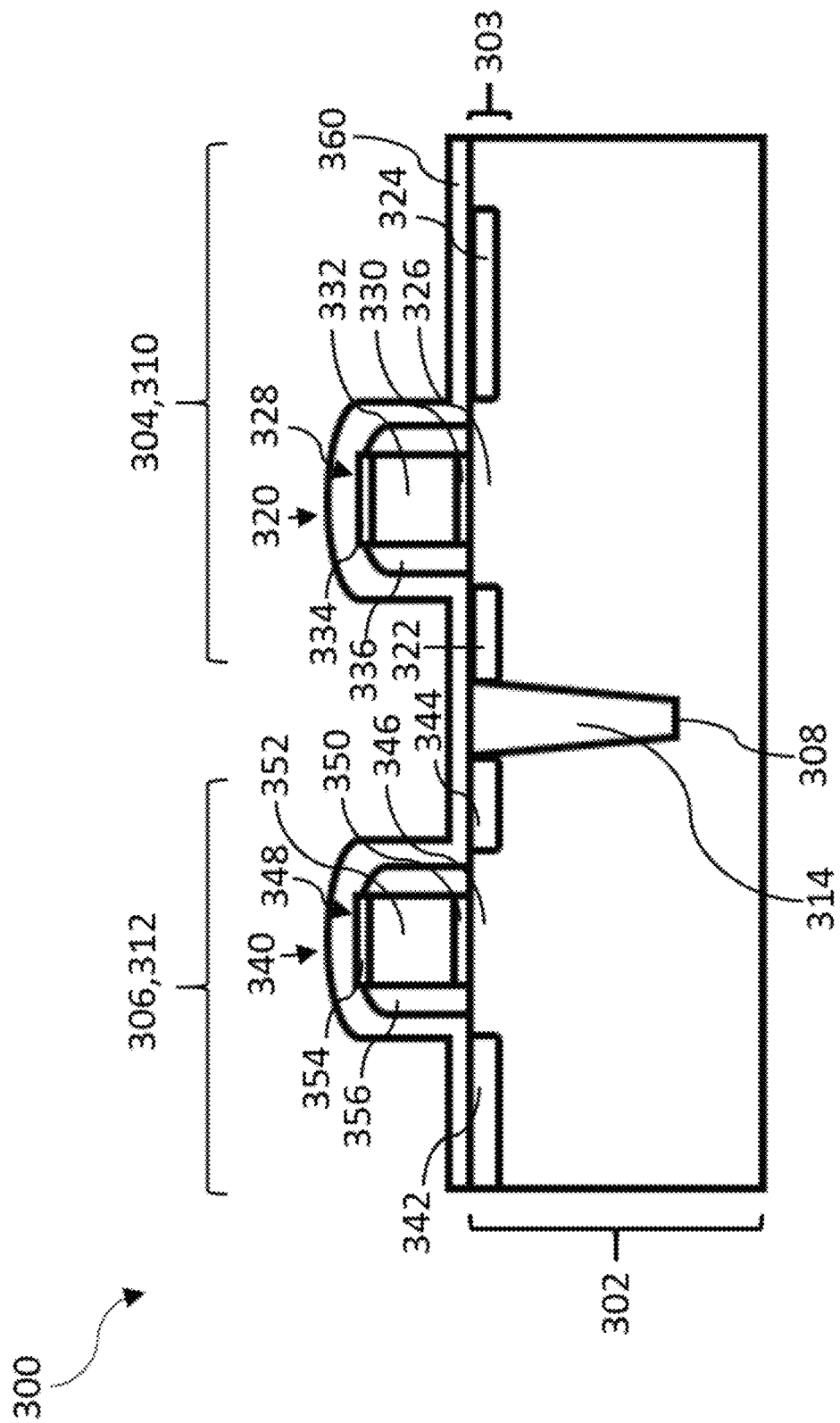
FIG. 4 shows a cross-sectional view of an initial structure of a portion of the 6T SRAM bitcell of FIG. 3 for forming an active contact-gate contact interconnect, according to embodiments of the disclosure.

FIGS. 3-4 include illustrative examples of a 6T SRAM bitcell 200 (see FIG. 1 for schematic 100 of standard 6T SRAM bitcell), for illustrating forming an active contact-gate contact interconnect, according to embodiments of the disclosure.

FIG. 3 shows a top view of an example portion of 6T SRAM bitcell structure 200, including a cross-coupling region CR according to embodiments of the disclosure. 6T SRAM bitcell 200 may include active regions (e.g., first active region 310, and second active region 312), gate electrodes (e.g., first gate electrode 328), active contacts (e.g. first active contact 400), contacts external cross-coupling region CR (e.g., external contact 420), gate contacts (e.g., first gate contact 410), and metal wires (e.g., interconnect 500 (i.e. first metal wire 502), and second metal wire 510).

FIG. 4 shows a cross-sectional view of a portion of 6T SRAM bitcell structure 200 of FIG. 3, including an illustrative example of an initial structure 300 for forming an interconnect 500 (see FIG. 7) in a cross-couple region CR (see FIGS. 1 and 3), according to embodiments of the disclosure. At this stage, initial structure 300 is provided including a semiconductor-on-insulator (SOI) substrate 302, wherein a first region 304 of SOI substrate 302 is isolated from a second region 306 in SOI substrate 302 by shallow trench isolation (STI) 308. SOI substrate 302 may include a semiconductor base substrate (not labeled), an insulator layer (not labeled) and a semiconductor-on-insulator (SOI) layer 303. An active region may be formed within first region 304 and/or second region 306. As shown in the example in FIG. 3, first region 304 of SOI substrate 302 may include a first active region 310, and second region 306 may include a second active region 312, which may include any region of SOI substrate 302 in which active devices are employed. Initial structure 300 may also include a contact etch stop liner (CESL) 360 formed over first active region 310, second active region 312, and STI 308. While two active regions 310, 312 and one STI 308 are shown in FIG. 4, it is understood that any number of active regions and/or any number of STIs desirable for 6T SRAM bitcell 200 may be formed.

In the instant example of FIG. 4, first active region 310 may include a first transistor 320. First transistor 320 may include source/drain regions 322, 324, and a channel region 326 in SOI layer 303 of SOI substrate 302 between source/drain regions 322, 324. First active region 310 may also include raised source/drain regions (not shown for simplification) formed over source/drain regions 322, 324, e.g. by epitaxial growth of silicon germanium. As understood, source drain regions 322, 324, may be doped, e.g., by ion implanting or in-situ doped as formed. As also known, a dopant element introduced into semiconductor can establish either p-type (acceptors) or n-type (donors) conductivity. Common dopants in silicon: for p-type—boron (B), indium (In); and for n-type—phosphorous (P) arsenic (As), antimony (Sb). Dopants are of two types—"donors" and "acceptors." N type implants are donors and P type are acceptors. First transistor 320 may also include a first gate electrode 328 including one or more gate dielectric layers 330, including but not limited to: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. First gate electrode 328 may also include a conductive body 332 (e.g., a metal such as copper or tungsten, or polysilicon), a silicide cap 334 and a spacer 336 thereabout. Spacer 336 may include any now known or later developed spacer material such as silicon nitride. Silicide cap 334 on gate electrode 328 and a silicide of silicided source/drain region (not shown) may be formed using any now known or later developed technique, e.g., performing an in-situ pre-clean, depositing a metal such as titanium, nickel, cobalt, etc., annealing to have the metal react with silicon, and removing unreacted metal. First transistor 320 may be formed by any now known or later developed semiconductor fabrication techniques for forming transistors.

In the instant example of FIG. 4, second active region 312 may include a second transistor 340. Second transistor 340 may include a second source/drain regions 342, 344, and a second channel region 346 in SOI layer 303 of SOI substrate 302 between second source/drain regions 342, 344. Second active region 312 may also include raised source/drain regions (not shown for simplification) formed over second source/drain regions 342, 344. Second transistor 340 may also include a second gate electrode 348 including one or more second gate dielectric layers 350. Second gate electrode 328 may also include a second conductive body 352, a second silicide cap 354 and a second spacer 356 thereabout. Second active region 312 including second transistor 340 may be formed by any now known or later developed semiconductor fabrication techniques for forming active regions including transistors. Second active region 312 including second transistor 340 may include any now known or layer developed semiconductor fabrication materials for forming active regions including transistors. For example, second active region 312 including second transistor 340 may be formed by the same or similar semiconductor fabrication techniques and materials as first active region 310 including first transistor 320.

STI 308 may include a shallow trench isolation (STI) dielectric fill 314 within a trench (not shown) formed within SOI substrate 302. The trench (not shown), may be formed by etching, or any other known or later developed semiconductor trench formation technique. STI dielectric fill 314 may be formed by deposition, or any other known or later developed semiconductor STI fill fabrication technique. STI 308, may be formed by any now known or later developed semiconductor fabrication techniques for forming STIs. In one non-limiting example, not shown, formation of STI dielectric fill 314 may include depositing first STI dielectric fill 314 material within a trench (not shown), and planarizing STI dielectric fill 314.

CESL 360 may include any now known or later developed etch stop material such as silicon nitride. In one embodiment, CESL 360 includes a stress therein, e.g. compression or tensile, so as to impart strain to at least part of first action region 310 and second active region 312, in a known fashion.

As discussed above, semiconductor substrate 302 may include a semiconductor base substrate (not shown), insulator layer (not shown), and SOI layer (not shown). Semiconductor base substrate (not shown) and SOI layer (not shown) may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of each layer may be strained. For example, SOI layer (not shown) (and/or epi layer thereover) may be strained.

Insulator layer (not shown) may include any now known or later developed dielectric used for SOI layers, such as but not limited to silicon dioxide or sapphire. As noted, the choice of insulator depends largely on intended, application, with sapphire being used for radiation-sensitive applications and silicon oxide preferred for improved performance and diminished short channel effects in microelectronics devices. The precise thickness of insulator layer (not shown) and topmost SOI layer (not shown) also vary widely with the intended application.

Initial structure 300 may be formed using any now known or later developed semiconductor fabrication techniques including by not limited to photolithography (and/or sidewall image transfer (SIT)). In lithography (or "photolithography"), a radiation sensitive "resist" coating is formed, e.g., deposited, over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Where materials are deposited, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

At this stage in conventional processing, a portion 311 (see FIG. 5) of first active region 310 and first gate electrode 328 within coupling region CR (see FIGS. 1 and 3) would be interconnected by formation and overlapping contacts 112, as shown in FIGS. 2a and 2b, of an active contact such as active contact 108 of FIGS. 2a and 2b, and gate contact such as gate contact 110 of FIGS. 2a and 2b. As noted in the discussion of FIGS. 1, 2a and 2b, where the CPP between gate electrodes has been reduced, gate shortages between neighboring gates are increasingly likely based on this conventional processing, which at the very least impacts performance and can render the device inoperative.

Figure 5:
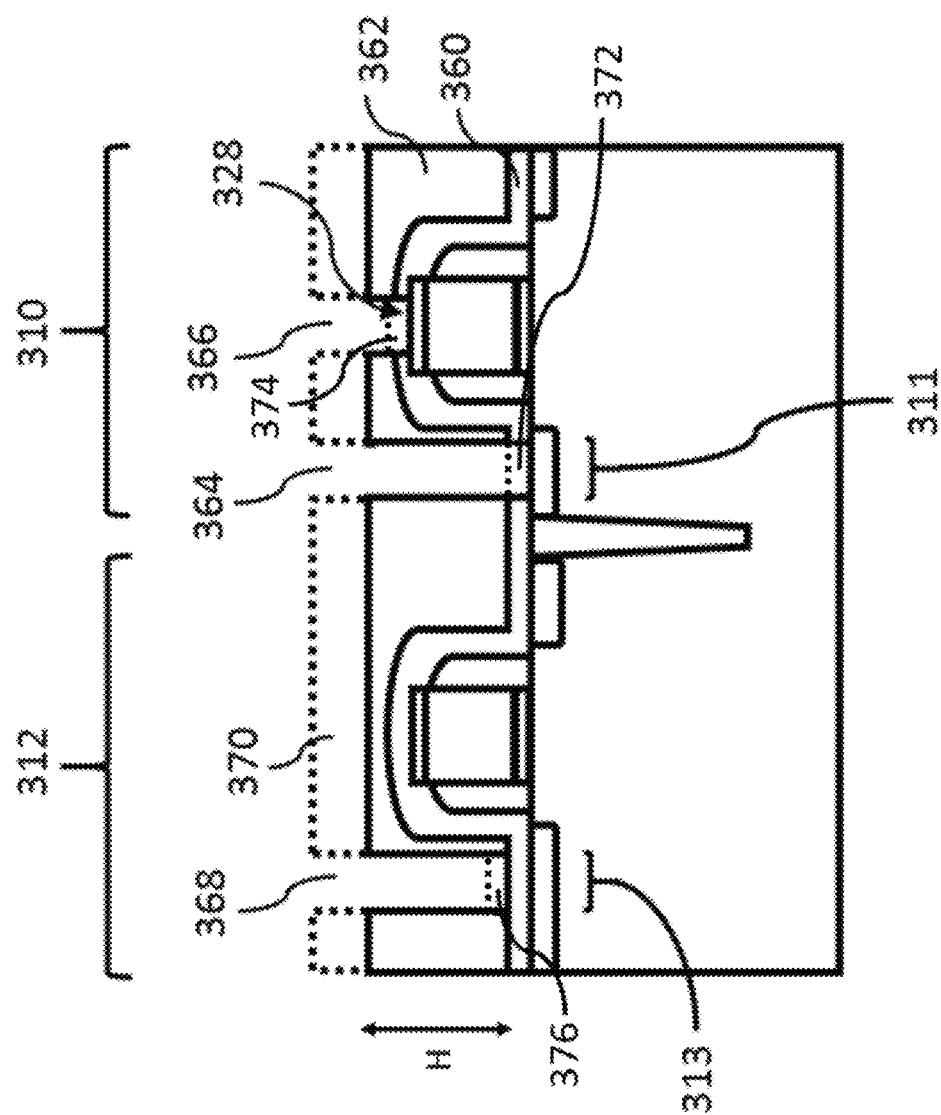
FIG. 5 shows a cross-sectional view of forming contact openings over the initial structure of FIG. 4 for forming an active contact-gate contact interconnect within the cross-coupling region, according to embodiments of the disclosure.
Figure 6:
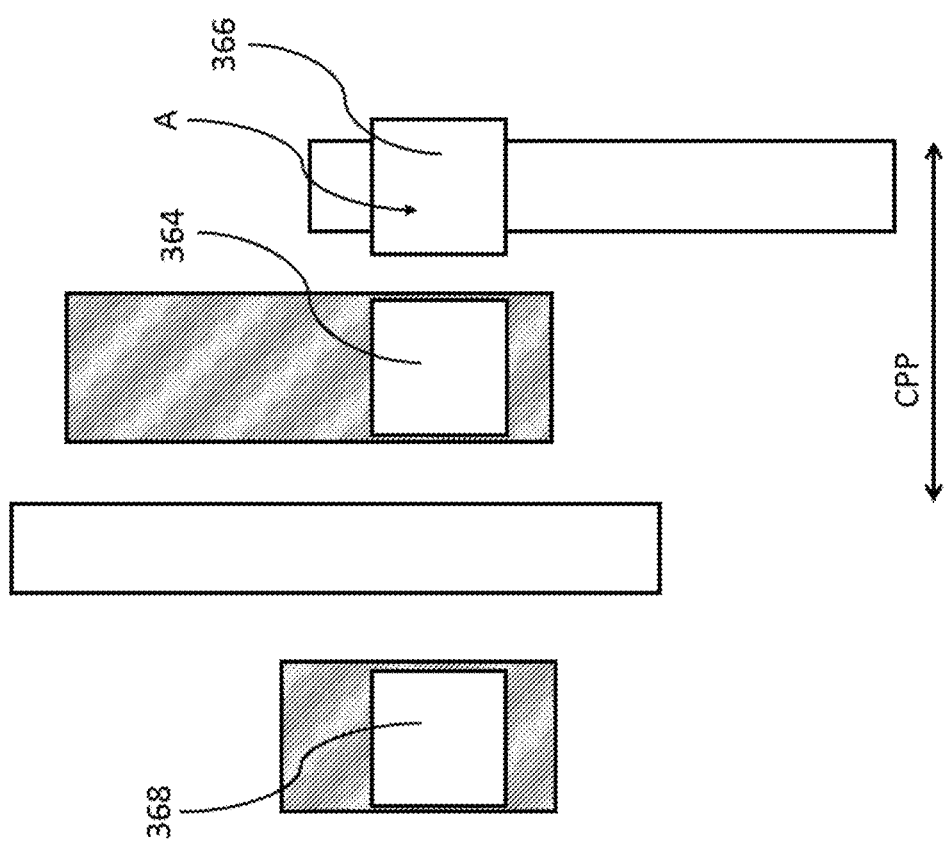
FIG. 6 shows a top view of contact openings of FIG. 5 illustrating an approximately equal surface area of each opening for formation of an active contact-gate contact interconnect, according to embodiments of the disclosure.
Figure 7:
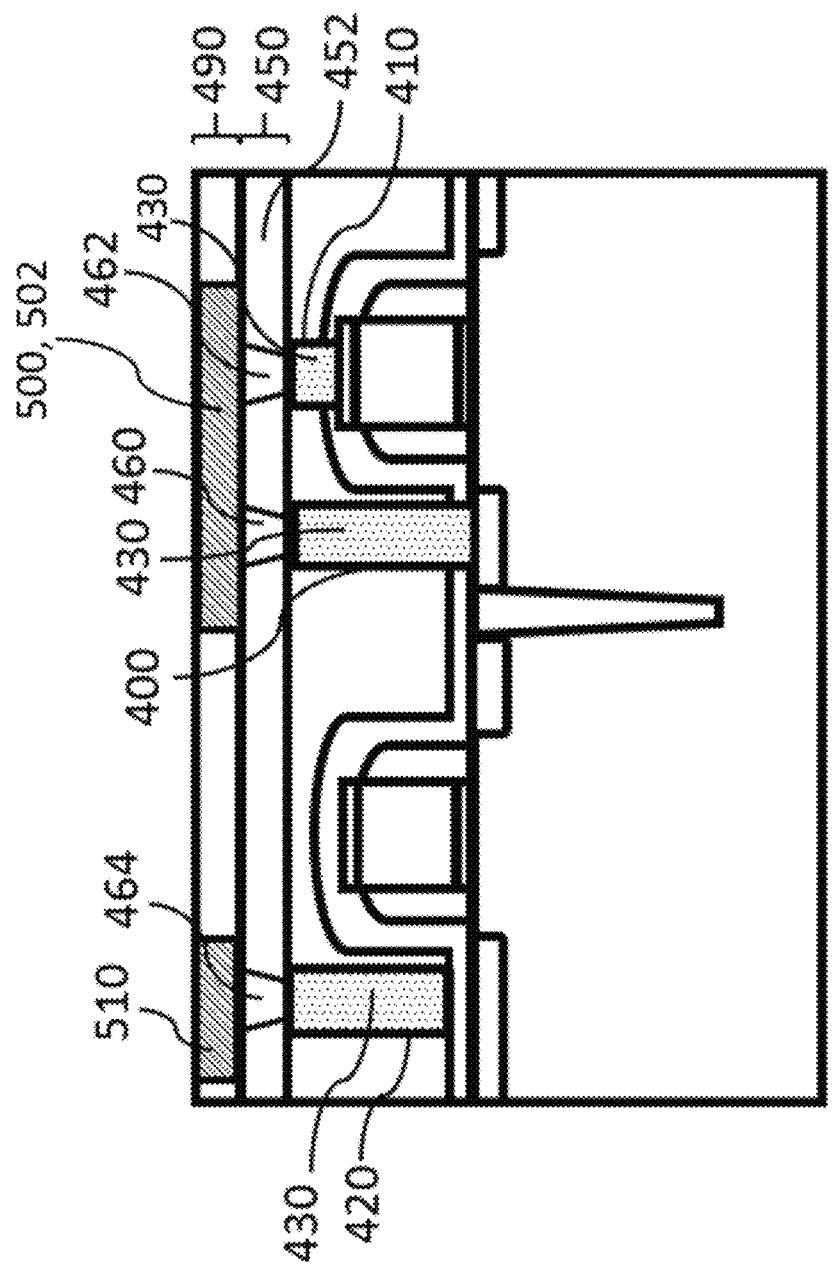
FIG. 7 shows a cross-sectional view of forming a first metal layer over the structure of FIG. 5, including an interconnect for an active contact and gate contact, according to embodiments of the disclosure.

As shown in FIGS. 5-7, in contrast to conventional processing, embodiments of the disclosure include forming a first active contact 400 (see FIGS. 7-8), a first gate contact 410 (see FIG. 7-8) and an external contact 420 (see FIG. 7-8), each including approximately equal surface area A (see FIG. 6), and forming interconnect 500 (see FIG. 7-8) between first active contact 400 (see FIG. 7-8) and first gate contact 410 (see FIG. 78) in a first metal layer 490 (see FIG. 7-8) to mitigate neighboring gate electrode shortage.

FIG. 5 shows a cross-section view of forming contact openings 364, 366, 368 through a first dielectric layer 362 on initial structure 300 (see FIG. 4) for a first active contact 400 (see FIG. 7-8), a first gate contact 410 (see FIG. 7-8), and an external contact 420 (see FIG. 7-8), respectively, according to embodiments of the disclosure. First dielectric layer 362 may be formed over CESL 360 of initial structure 300 (see FIG. 4), e.g., by deposition. First dielectric layer 360 may include may include any interlevel or intralevel dielectric material including inorganic dielectric materials, organic dielectric materials, or combinations thereof. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Contact openings 364, 366, 368 to a portion 311 of first active region 310, first gate electrode 328 and portion 313 of second active region 312, respectively may be formed through CESL 360 and first dielectric layer 362. Contact openings 364, 366, 368 may be formed using photolithography, i.e., with a mask 370 (in phantom) which can be removed in a conventional manner once contact openings 364, 366, 368 are formed. As will be discussed herein, contact openings 364, 366, 368 may include, for example, approximately equal surface area A (see FIG. 6), according to embodiments of the disclosure.

In one non-limiting example, etch-resistant layers 372, 374, 376 (in phantom) may be formed over gate electrode 328 and/or portion 311 of first active region 310 and/or portion 313 of second active region 312, and/or between gate electrode 328 and/or portion 311 of first active region 310 and/or portion 313 of second active region 312. A portion of contact openings 364, 366, 368 may be positioned over etch resistant layers 372, 374, 376, respectively. In this fashion, etch resistant layers 372, 374, 376 may, for example, accommodate mis-alignment of contact openings 364, 366, 368 or oversizing of contact openings 364, 366, 368. For example, first etch resistant layer 372 may be formed over at least portion 311 first active region 310 and/or portion 313 second active region 312. First etch resistant layer 372 may include, for example any now known or later developed material which may be etch resistant to any now known or later developed etchant for forming contact opening 366 to a first gate electrode 328. In another example, second etch resistant layer 374 may be formed over gate electrode 328. Second etch resistant layer 374 may include, for example any now known or later developed material which may be etch-resistant to any now known or later developed etchant for forming contact opening 364, 368 to first active region 310 and/or second active region 312 respectively. In yet another example, a third etch resistant layer 376 may be formed between portion 311 of first active region 310 and/or portion 313 of second active region 312, and first gate electrode 328. Third etch resistant layer 376 may include, for example any now known or later developed material which may be etch resistant any now known or later developed etchant for forming contact openings 364, 366, 368 to portion 311 of first active region 310 and/or portion 313 of second active region 312 and/or first gate electrode 328.

While two contact openings 364, 368 to portions of active regions are shown in this embodiment, it is understood that any number of contact openings to any number of active region portions desirable for 6T SRAM bitcell 200 (see FIGS. 1 and 3) may be formed. While one contact opening 366 to a gate electrode is shown in this embodiment, it is understood that any number of contact openings to any number of gate electrodes desirable for 6T SRAM bitcell 200 (see FIGS. 1 and 3) may be formed.

Figure 8:
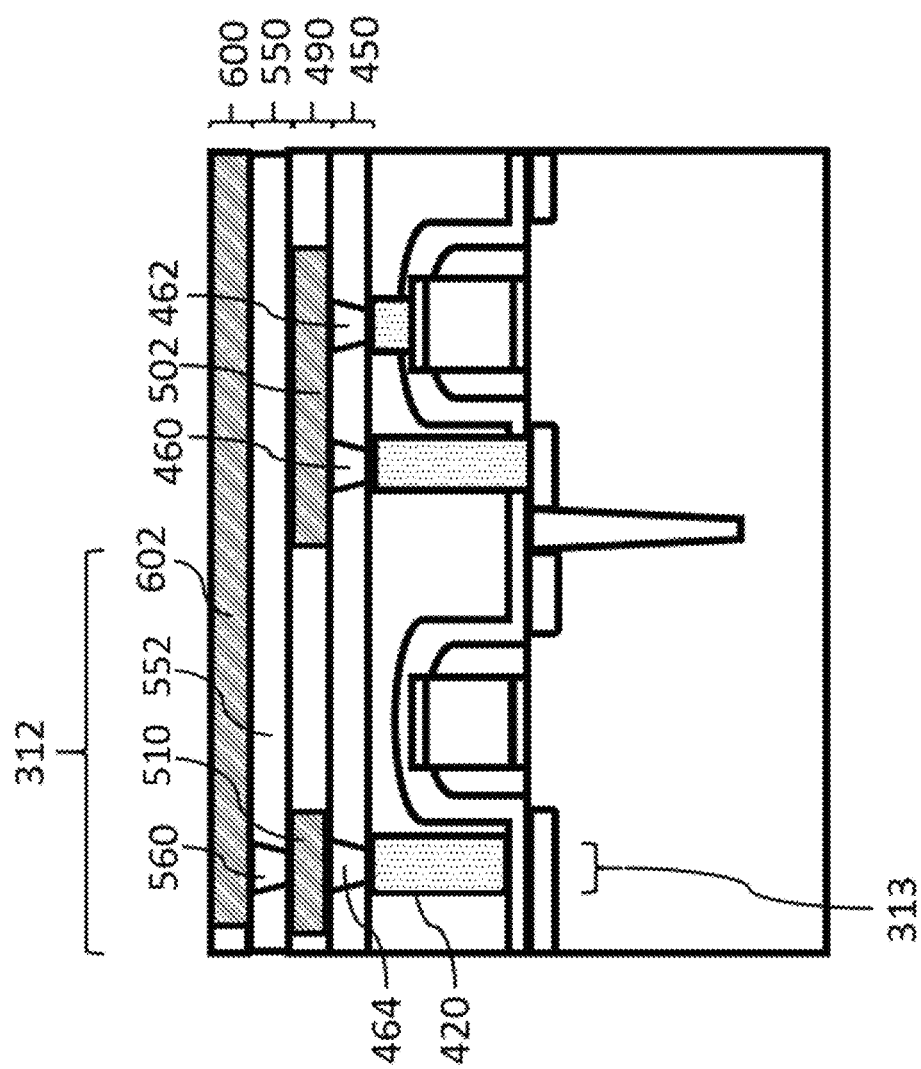
FIG. 8 shows a cross-sectional view of forming a second metal layer over the structure of FIG. 7 for routing external components including connecting a wire in the second metal layer to the initial structure of FIG. 4 through a wire in the first metal layer, according to embodiments of the disclosure.

FIG. 6 shows a top view of forming contact openings 364, 366, 368 through first dielectric layer 362 (see FIG. 5) over initial structure 300 (see FIG. 4) for a first active contact 400 (see FIG. 7), a first gate contact 410 (see FIG. 7), and an external contact 420 (see FIG. 7), respectively, according to embodiments of the disclosure. As best illustrated in FIG. 6, contact openings 364, 366, 368 may include, for example, approximately equal surface area A. Approximately equal surface area A may include any geometry sufficient to prevent shortage of neighboring gate electrodes (e.g., a second gate electrode 106 with respect to first gate electrode 102, as shown in FIG. 2b) during forming of interconnect 500 (see FIG. 7) between first active contact 400 (see FIG. 7) and first gate contact 410 (see FIG. 7), as will be discussed herein. As shown in the example of FIG. 6, approximately equal surface area A may include a substantially square geometry. As shown in the example of FIG. 8, the shape of approximately equal surface area A may extend throughout height H of contact openings 364, 366, 368. Approximately equal surface area A may include any size sufficient to prevent shortage of neighboring gate electrodes (e.g., a second gate electrode 106 with respect to first gate electrode 102, as shown in FIG. 2b) during forming of interconnect 500 (see FIG. 7) between first active contact 400 (see FIG. 7) and first gate contact 410 (see FIG. 7), as will be discussed herein.

FIG. 7 shows a cross-sectional view of forming first active contact 400, a first gate contact 410, and an external contact 420 within contact openings 364, 366, 368 (see FIGS. 5 and 6), respectively, according to embodiments of the disclosure. FIG. 7 also shows a cross sectional view of forming an interconnect 500 (i.e., first metal wire 502) electrically connecting first active contact 400 and first gate contact 410 within cross-coupling region CR (see FIGS. 1 and 3), and a second metal wire 510 to external contact 420, according to embodiments of the disclosure.

Forming first active contact 400, first gate contact 410, and external contact 420 may include depositing a liner (not shown for simplicity) in contact openings 364, 366, 368, then depositing a conductor 430 in contact openings 364, 366, 368 (see FIGS. 5 and 6) and planarizing the conductor. First active contact 400, first gate contact 410 and external contact 420 may include approximately equal surface area A of contact openings 364, 366, 368 (see FIG. 6). Liner (not shown for simplicity) may include any conventional liner material such as ruthenium; however, other refractory metals such as tantalum (Ta), titanium (Ti), tungsten (W), iridium (Jr), rhodium (Rh) and platinum (Pt), etc., or mixtures of thereof, may also be employed. Conductor 348 may include, for example, copper or tungsten. The planarizing can be carried out using any now known or later developed technique such as but not limited to chemical mechanical planarization (CMP). It is emphasized that method of forming first active contact 400, external contact 420, and first gate contact 410 may include any variety of intermediate steps not described herein but understood with those with skill in the art.

While FIG. 7 shows forming only first active contact 400, and first gate contact 410 of cross-coupling region CR (see FIGS. 1 and 3), it is understood that any number of active contacts, and gate contacts desirable in a semiconductor structure, for example for a cross-coupling region CR (see FIGS. 1 and 3) in 6T SRAM bitcell 200 (see FIGS. 1 and 3) may be formed. While FIG. 7 shows forming one external contact 420 outside of cross-coupling region CR (see FIGS. 1 and 3) it is understood that any number of external contacts desirable for a semiconductor structure may be formed. While FIG. 7 shows external contact 420 as an active contact to portion 313 of second active region 312, it is understood any number of external contacts to any portion of any active region and/or gate electrode may be formed. For example, another external contact to second gate electrode 348 may be formed.

Forming interconnect 500 may include forming a first via layer 450 including vias 460, 462, 464. Forming first via layer 450 may include forming a second dielectric layer 452 over first dielectric layer 362, first active contact 400, external contact 420, and first gate electrode 410. Second dielectric layer 452 may be formed by deposition, and/or any other now known or later developed semiconductor fabrication techniques for forming interlayer dielectrics. Vias 460, 462, 464 may be formed through first via layer 450 over first active contact 400, external contact 420, and first gate electrode 410, respectively. Vias 460, 462, 464 may be formed by patterning, etching, and/or any other now known or later developed semiconductor fabrication techniques for forming vias. In one non-limiting example, vias 460, 462, 464 may be formed by patterning, etching, filling with a conductor and planarizing. Vias may include any now known or later developed materials for via formation. Second dielectric layer 450 may include may include any interlevel or intralevel dielectric material including inorganic dielectric materials, organic dielectric materials, or combinations thereof. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Forming interconnect 500 may include forming a first metal layer 490 over via layer 450 and vias 460, 462, 464. First metal layer 490 may include interconnect 500 (i.e. first metal wire 502), and second metal wire 510. First metal wire 502 may be formed over a portion of first active contact 400 and extend over a portion of first gate contact 410, for example, within cross-coupling region CR (see FIGS. 1 and 3). Second metal wire 510 may be formed for example over a portion of external contact 420, located external of crosscouple region CR (see FIGS. 1 and 3). As will be discussed herein, second metal wire 510 may connect another metal wire (e.g., third metal wire 602 of FIG. 8) in another subsequently formed metal layer (e.g. third metal layer 600 of FIG. 8) to portion 311 (see FIG. 8) of second active region 312 (see FIG. 8) through external contact 420. In one non-limiting example, first metal wire 502 and second metal wire 510 may be formed simultaneously. First metal wire 502 and second metal wire 510 may be formed by any now known or later known semiconductor fabrication techniques for forming metal within a metal layer. First metal wire 502 and second metal wire 510 may include aluminum, copper, and/or any other materials desirable for forming metal wires in a semiconductor structure metal layer.

Formation of first active contact 400, external contact 420, and first gate contact 410, including approximately equal surface area A may for example, improve printability, as well as preventing shortages with neighboring gates. Formation of interconnect 500 (i.e. first metal wire 502) in first metal layer 490 may for example mitigate the risk of gate shortage by preventing the need for contact overlap during formation. Formation of second metal wire 510 in first metal layer 490 may for example increase the efficiency and effectiveness of fabricating 6T SRAM bitcells by preventing the need for additional processing steps for creating connections through first metal layer 490.

While two metal wires 502, 510 are shown in FIG. 7, it is understood that any number of wires in first metal layer 490 as may be desirable for interconnecting any number of gate contacts and active contacts, and/or for connecting additional wires in subsequently formed metal layers, may be formed. In an illustrative example not shown, a fourth metal wire may be formed in first metal layer 490 as a second interconnect in coupling region CR, for example to interconnect a second gate contact of a second gate electrode to a second active contact of the first active region, and for example cross-couple inverters INV1, INV2 of FIG. 1. In another non-limiting example not shown, a fifth metal wire may be formed in first metal layer 490 to connect a contact to second gate electrode 348 (see FIG. 4) to a metal wire in a subsequently formed metal layer.

FIG. 8 shows a cross-sectional view of forming a second via layer 550 and second metal layer 600, according to embodiments of the disclosure. Formation of second via layer 550 may include forming a third dielectric layer 552 over first metal layer 490. Via 560, may be formed in second via layer 550 over second metal wire 510. As shown in the example of FIG. 8, via 560 may connect a third metal wire 602 to second metal wire 510. Second via layer 550 and via 560 may be formed by any now known or later developed semiconductor fabrication techniques. For example, second via layer 550 and via 560 may be formed by the same and/or similar techniques and materials as first via layer 450 and vias 460, 462, 464, as discussed herein with respect to FIG. 7 above.

Second metal layer 600 may be formed over second via layer 550 and via 560. Second metal layer 600 may include third metal wire 602. In one non-limiting example, third metal wire 602 may be used to route an external component (not shown) to portion 313 of second active region 312. Third metal wire 602 may be connected to portion 313 of second active region 312 through via 560, second metal wire 510, via 464, and external contact 420.

Third metal wire 602 may be formed by any now known or later developed semiconductor fabrication techniques. For example, third metal wire 602 may be formed by the same and/or similar techniques and materials as first metal wire 502 and/or second metal wire 510, as discussed herein with respect to FIG. 7. While third metal wire 602 is the only metal wire shown in second metal layer 600 of FIG. 8 for routing external components (not shown) to 6T SRAM bitcell 200 (see FIGS. 1 and 3), it is understood that any number of metal wires may be formed in any number of metal layers for routing any number of external components to any number of active regions and/or gate electrodes, as may be desirable for fabrication of the SRAM bitcell.

External component (not shown), may include any desirable external component for 6T SRAM bitcell 200 (see FIGS. 1 and 3). In non-limiting examples, external component (not shown) may include a voltage source, a bitline, and/or a wordline.

The methods of forming a gate contact, active contact, and interconnect herein provide a cost effective manner of mitigating neighboring gate electrode shortage as contact poly-pitch (CPP) decreases. Additionally, the methods include lithography friendly layouts for effective printability. The methods of forming a second metal wire in the same metal layer as the interconnect provide a cost and time effect manner of layer connection.

The method as described above is used in the fabrication of integrated circuit chips, for example a six-transistor static random access memory (6T SRAM) bitcell. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially square" may refer to a shape having four major sides, but with some variation in the shape of the sides, or the number of additional minor sides provided.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated. Although a 6T SRAM bitcell 200 is shown in FIGS. 1-8, it is understood that the embodiments herein may be used in any suitable semiconductor structure.

What is claimed is:

1. A static random access memory (SRAM) bitcell structure comprising:
   a gate contact via positioned in a zero via layer and contacting a gate electrode of an active region in a substrate;
   an active contact via positioned in the zero via layer and contacting another portion of the active region, wherein the active contact via and the gate contact via include an approximately equal surface area;

a first interconnect via in a first via layer positioned above the zero via layer, the first interconnect via directly contacting and electrically connected to the gate contact via;

a second interconnect via in the first via layer laterally separated from the first interconnect via, the second interconnect via directly contacting and electrically connected to the active contact via; and an interconnect, the interconnect electrically connecting the active contact via to the gate contact via, wherein the interconnect includes a first metal wire in a first metal layer above the first via layer and directly contacting the first interconnect via and the second interconnect via.

2. The SRAM bitcell of claim 1, wherein the approximately equal surface area is square.

3. The SRAM bitcell of claim 1, wherein a contacted poly pitch (CPP) between the first gate electrode and a second gate electrode of the SRAM bitcell is at most 45 nanometers (nm).

4. The SRAM bitcell of claim 1, further comprising an external contact via positioned in the zero via layer and contacting a second active region in the substrate, wherein the external contact via includes the approximately equal surface area.

5. The SRAM bitcell of claim 4, further comprising:

a second metal wire in the first metal layer over a portion of the external contact via; and a second metal layer over the first metal layer, the second meta layer including a third metal wire, wherein the second metal wire is configured to electrically connect the third metal wire to the external contact via.

6. The SRAM bitcell of claim 5, wherein the third metal wire is configured to route an external component to the second active region through the second wire.

7. The SRAM bitcell of claim 5, wherein the external component comprises one of a wordline, a bitline, or a voltage source.

8. A static random access memory (SRAM) bitcell structure comprising:

a gate contact via positioned in a zero via layer and contacting a gate electrode of an active region in a substrate;

an active contact via positioned in the zero via layer and contacting a first active portion of the active region, wherein the active contact via and the gate contact via include an approximately equal surface area;

a first interconnect via in a first via layer positioned above the zero via layer, the first interconnect via directly contacting and electrically connected to the gate contact via;

a second interconnect via in the first via layer laterally separated from the first interconnect via, the second interconnect via directly contacting electrically connected to the active contact via;

an interconnect electrically connecting the active contact via to the gate contact via, wherein the interconnect includes a first metal wire in a first metal layer directly contacting a portion of the active contact via and a portion of the gate contact via;

an external contact via positioned in the zero via layer and contacting a second active portion in the substrate, the external contact via laterally separated from the gate contact via and the active contact via; and a second metal wire in a second metal layer above the first metal layer, the second metal wire being configured to route an external component to the second active region through the second wire, wherein the external component comprises one of a wordline, a bitline, or a voltage source.

* * * * *